US006784818B2

(12) United States Patent
Mulder (10) Patent No.: US 6,784,818 B2
(45) Date of Patent: Aug. 31, 2004

(54) ANALOG TO DIGITAL CONVERTER WITH INTERPOLATION OF REFERENCE LADDER

(75) Inventor: Jan Mulder, Houten (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/748,250

(22) Filed: Dec. 31, 2003

(65) Prior Publication Data

US 2004/0150544 A1 Aug. 5, 2004

Related U.S. Application Data

(63) Continuation of application No. 10/158,774, filed on May 31, 2002, now Pat. No. 6,697,005, which is a continuation-in-part of application No. 10/158,193, filed on May 31, 2002, now Pat. No. 6,720,798, which is a continuation-in-part of application No. 10/158,595, filed on May 31, 2002, now Pat. No. 6,573,853, which is a continuation-in-part of application No. 10/158,773, filed on May 31, 2002, now Pat. No. 6,583,747, which is a continuation-in-part of application No. 10/153,709, filed on May 24, 2002, now Pat. No. 6,628,224.

(51) Int. Cl.[7] ........................ H03M 1/78; H03M 1/12; H03K 5/22
(52) U.S. Cl. ........................ 341/154; 341/156; 327/65
(58) Field of Search ................. 341/154, 156, 341/118, 120, 159, 155; 327/65, 3; 702/107

(56) References Cited

U.S. PATENT DOCUMENTS

| 3,697,978 A | | 10/1972 | Prill ............................ 341/122 |
| 3,798,557 A | * | 3/1974 | Scott et al. ..................... 327/3 |
| 3,846,712 A | | 11/1974 | Kiko .......................... 336/261 |
| 4,959,563 A | | 9/1990 | Schenck ...................... 326/27 |
| 5,006,727 A | | 4/1991 | Ragosch et al. ............ 327/306 |
| 5,118,971 A | | 6/1992 | Schenck ....................... 326/32 |
| 5,157,397 A | | 10/1992 | Vernon ........................ 341/159 |
| 5,191,336 A | | 3/1993 | Stephenson .................. 341/111 |
| 5,302,869 A | | 4/1994 | Hosotani et al. ............... 327/75 |
| 5,422,642 A | | 6/1995 | Chung et al. ................ 341/118 |
| 5,471,210 A | | 11/1995 | Wingender et al. ......... 341/156 |
| 5,554,943 A | | 9/1996 | Moreland ..................... 327/65 |
| 5,867,116 A | | 2/1999 | Nakamura et al. .......... 341/159 |
| 5,973,632 A | | 10/1999 | Tai .............................. 341/156 |
| 6,169,502 B1 | | 1/2001 | Johnson et al. ............. 341/120 |
| 6,259,745 B1 | | 7/2001 | Chan .......................... 375/285 |
| 6,346,902 B1 | | 2/2002 | Venes et al. ................. 341/154 |
| 6,489,913 B1 | | 12/2002 | Hansen et al. .............. 341/156 |
| 6,518,898 B1 | | 2/2003 | Choksi ........................ 341/118 |
| 6,573,853 B1 | * | 6/2003 | Mulder ........................ 341/155 |
| 6,583,747 B1 | * | 6/2003 | van der Goes et al. ..... 341/156 |
| 6,628,224 B1 | * | 9/2003 | Mulder et al. .............. 341/156 |
| 6,697,005 B2 | * | 2/2004 | Mulder ........................ 341/154 |
| 6,714,886 B2 | * | 3/2004 | Sung et al. .................. 702/107 |
| 6,720,798 B2 | * | 4/2004 | Mulder et al. ................ 327/65 |
| 6,720,901 B2 | * | 4/2004 | Nakamoto .................. 341/156 |

OTHER PUBLICATIONS

Miyazaki, et al., "A 16 mVY 30Msample/s 10b Pipelined A/D Converter Using a Pseudo–Differential Architecture," *IEEE, International Solid–State Circuits Conference 2002*, IEEE Feb. 5, 2002, 3 pages.

Sushihara et al., "A 7b 450Msample/s 50mW CMOS ADC in 0.3 mm$^2$," *IEEE International Solid–State Circuits Conference 2002*, IEEE, Feb. 5, 2002, 3 pages.

(List continued on next page.)

*Primary Examiner*—Patrick Wamsley
(74) *Attorney, Agent, or Firm*—Sterne, Kessler, Goldstein & Fox P.L.L.C.

(57) ABSTRACT

An N-bit analog to digital converter includes a reference ladder connected to an imput voltage at one end, and to ground at another end, an array of differential amplifiers whose differential inputs are connected to taps from the reference ladder, wherein each amplifier has a first differential input connected to the same tap as a neighboring amplifier, and a second differential imput shifted one tap from the neighboring amplifier, and an encoder that converts outputs the array to an N-bit output.

40 Claims, 8 Drawing Sheets

OTHER PUBLICATIONS

Dingwall et al., "An 8–MHz CMOS Subranging 8–Bit A/D Converter," *IEEE Journal of Solid–State Circuits*, vol. SC–20, No. 6, Dec. 1985, pp. 1138–1143.

Abo, A.M. and Gray, P.R., "A 1.5–V, 10–bit, 14.3–MS/s CMOS Pipeline Analog–to–Digital Converter," *IEEE Journal of Solid–State Circuits*, vol. 34, No. 5, May 1999, pp. 599–606.

Brandt, B.P. and Lutsky, J., "A 75–mW, 10–b, 20–MSPS CMOS Subranging ADC with 9.5 Effective Bits at Nyquist," *IEEE Journal of Solid–State Circuits*, IEEE, vol. 34, No. 12, Dec. 1999, pp. 1788–1795.

Bult, K. and Buchwald, A., "An Embedded 240–mW 10–b 50–MS/s CMOS ADC in 1–mm$^2$," *IEEE Journal of Solid–State Circuits*, IEEE, vol. 32, No. 12, Dec. 1997, pp. 1887–1895.

Cho, T.B. and Gray, P.R., "A 10b, 20 Msample/s, 35 mW Pipeline A/D Converter," *IEEE Journal of Solid–State Circuits*, IEEE, vol. 30, No. 3, Mar. 1995, pp. 166–172.

Choe, M.–J. et al., "A 13–b 40–Msample/s CMOS Pipelined Folding ADC with Background Offset Trimming," *IEEE Journal of Solid–State Circuits*, IEEE, vol. 35, No. 12, Dec. 2000, pp. 1781–1790.

Choi, M. and Abidi, A., "A 6–b 1.3–Gsample/s A/D Converter in 0.35–$\mu$m CMOS," *IEEE Journal of Solid–State Circuits*, IEEE, vol. 36, No. 12, Dec. 2001, pp. 1847–1858.

Flynn, M. and Sheahan, B., "A 400–Msample/s, 6–b CMOS Folding and Interpolating ADC," *IEEE Journal of Solid–State Circuits*, IEEE, vol. 33, No. 12, Dec. 1998, pp. 1932–1938.

Geelen, G., "A 6b 1.1 Gsample/s CMOS A/D Converter," *IEEE International Solid–State Circuits Conference*, IEEE, Feb. 6, 2001, pp. 128–129 and 438.

Hoogzaad, G. and Roovers, R., A 65–mW, 10–bit, 40–Msample/s BiCMOS Nyquist ADC in 0.8 mm$^2$, *IEEE Journal of Solid–State Circuits*, IEEE, vol. 34, No. 12, Dec. 1999, pp. 1796–1802.

Hosotani, S. et al., "An 8–bit 20–MS/s CMOS A/D Converter with 50–mW Power Consumption," *IEEE Journal of Solid–State Circuits*, IEEE, vol. 25, No. 1, Feb. 1990, pp. 167–172.

Ingino, J. and Wooley, B., "A Continuously Calibrated 12–b, 10–MS/s, 3.3–V A/D Converter," *IEEE Journal of Solid–State Circuits*, IEEE, vol. 33, No. 12, Dec. 1998, pp. 1920–1931.

Ito, M. et al., "A 10 bit 20 MS/s 3 V Supply CMOS A/D Converter," *IEEE Journal of Solid–State Circuits*, IEEE, vol. 29, No. 12, Dec. 1994, pp. 1531–1536.

Kattman, K. and Barrow, J., "A Technique for Reducing Differential Non–Linearity Errors in Flash A/D Converters," *IEEE International Solid–State Conference*, IEEE, 1991, pp. 170–171.

Kusumoto, K. et al., "A 10–b 20–MHz 30–mW Pipelined Interpolating CMOS ADC," *IEEE Jouranl of Solid–State Circuits*, IEEE; vol. 28, No. 12, Dec. 1993, pp. 1200–1206.

Lewis, S. et al., "A 10–b 20–Msample/s Analog–to–Digital Converter," *IEEE Journal of Solid–State Circuits*, IEEE, vol. 27, No. 3, Mar. 1992, pp. 351–358.

Mehr, I. and Singer, L., "A 55–mW, 10–bit, 40–Msample/s Nyquist–Rate CMOS ADC," *IEEE Journal of Solid–State Circuits*, IEEE, vol. 35, No. 3, Mar. 2000, pp. 318–325.

Nagaraj, K. et al., "Efficient 6–Bit A/D Converter Using a 1–Bit Folding Front End," *IEEE Journal of Solid–State Circuits*, IEEE, vol. 34, No. 8, Aug. 1999; pp. 1056–1062.

Nagaraj, K. et al., "A Dual–Mode 700–Msample/s 6–bit 200–Msample/s 7–bit A/D Converter in a 0.25–$\mu$m Digital CMOS Process," *IEEE Journal of Solid–State Circuits*, IEEE, vol. 35, No. 12, Dec. 2000, pp. 1760–1766.

Nauta, B. and Venes, A., "A 70–MS/s 110–mW 8–b CMOS Folding and Interpolating A/D Converter," *IEEE Journal of Solid–State Circuits*, IEEE, vol. 30, No. 12, Dec. 1995, pp. 1302–1308.

Pan, H. et al., "A 3.3–V 12–b 50–MS/s A/D Converter in 0.6$\mu$m CMOS with over 80–dB SFDR," *IEEE Journal of Solid–State Circuits*, IEEE, vol. 35, No. 12, Dec. 2000, pp. 1769–1780.

Song, W.–C. et al., "A 10–b 20–Msample/s Low–Power CMOS ADC," *IEEE Journal of Solid–State Circuits*, IEEE, vol. 30, No. 5, May 1995, pp. 514–521.

Sumanen, L. et al., "A 10–bit 200–MS/s CMOS Parallel Pipeline A/D Converter," *IEEE Journal of Solid–State Circuits*, IEEE, vol. 36, No. 7, Jul. 2000, pp. 1048–1055.

Taft, R. and Tursi, M., "A 100–MS/s 8–b CMOS Subranging ADC with Sustained Parametric Performance from 3.8 V Down to 2.2 V," *IEEE Journal of Solid–State Circuits*, IEEE, vol. 36, No. 3, Mar. 2001, pp. 331–338.

van der Ploeg, H. and Remmers, R., "A 3.3–V, 10–b, 25–Msample/s Two–Step ADC in 0.35–$\mu$m CMOS," *IEEE Journal of Solid–State Circuits*, IEEE, vol. 34, No. 12, Dec. 1999, pp. 1803–1811.

van der Ploeg, H. et al., "A 2.5–V 12–b 54–Msample/s 0.25–$\mu$m CMOS ADC in 1–mm$^2$ with Mixed–Signal Chopping and Calibration," *IEEE Journal of Solid–State Circuits*, vol. 36, No. 12, Dec. 2001, pp. 1859–1867.

Vorenkamp, P. and Roovers, R., "A 12–b, 60–Msample/s Cascaded Folding and Interpolating ADC," *IEEE Journal of Solid–State Circuits*, IEEE, vol. 32, No. 12, Dec. 1997, pp. 1876–1886.

Wang, Y–T. and Razavi, B., "An 8–Bit 150–MHz CMOS A/D Converter," *IEEE Journal of Solid–State Circuits*, IEEE, vol. 35, No. 3, Mar. 2000, pp. 308–317.

Yotsuyanagl, M. et al., "A 2 V, 10 b, 20 Msample/s, Mixed–Mode Subranging CMOS A/D Convert r," *IEEE Journal of Solid–State Circuits*, IEEE, vol. 30, No. 12, 1995, pp. 1533–1537.

Yu, P. and Lee, H–S., "A 2.5–V, 12–b, 5–Msample/s Pipelined CMOS ADC," *IEEE Journal of Solid–State Circuits*, IEEE, vol. 31, No. 12, Dec. 1996, pp. 1854–1861.

\* cited by examiner

FIG. 1

Conventional Art

ANALOG TO DIGITAL CONVERTER WITH INTERPOLATION OF REFERENCE LADDER

CROSS-REFERENCE TO RELATED APPLICATIONS

This application is a Continuation of application Ser. No. 10/158,774, Filed: May 31, 2002 now U.S. Pat. No. 6,697,005, Titled: ANALOG TO DIGITAL CONVERTER WITH INTERPOLATION OF REFERENCE LADDER, Inventor: Jan MULDER, which is a Continuation-in-Part of application Ser. No. 10/153,709, Filed: May 24, 2002 now U.S. Pat. No. 6,628,224, Titled: DISTRIBUTED AVERAGING ANALOG TO DIGITAL CONVERTER TOPOLOGY, Inventors: MULDER et al.; application Ser. No. 10/158,193, Filed: May 31, 2002 now U.S. Pat. No. 6,720,798; Titled: CLASS AB DIGITAL TO ANALOG CONVERTER/LINE DRIVER, Inventors: Jan MULDER et al.; application Ser. No. 10/158,595, Filed: May 31, 2002 now U.S. Pat. No. 6,573,853, Titled: HIGH SPEED ANALOG TO DIGITAL CONVERTER, Inventor: Jan MULDER; and application Ser. No. 10/158,773, Filed: May 31, 2002 now U.S. Pat. No. 6,583,747, Inventor: Jan MULDER; Titled: SUBRANGING ANALOG TO DIGITAL CONVERTER WITH MULTI-PHASE CLOCK TIMING, Inventors: van der GOES et al., all of which are incorporated by reference herein.

BACKGROUND OF THE INVENTION

1. Field of the Invention

The present invention relates to an analog to digital converter, and more particularly, to an analog to digital converter that minimizes a number of connections and taps to the reference ladder.

2. Related Art

Figure 1:
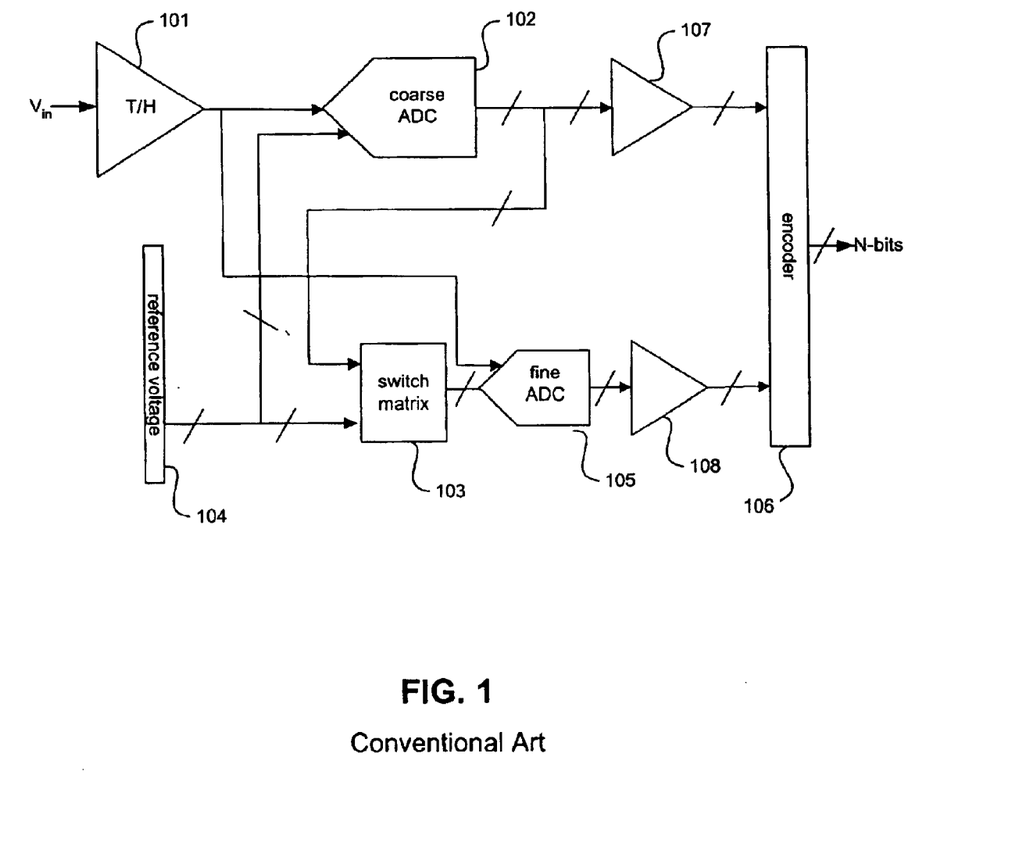
FIG. 1 represents a generalized 2-step subranging an ADC architecture.

A subranging analog to digital converter (ADC) architecture is suitable for implementing high-performance ADC's (i.e. high speed, low power, low area, high resolution). FIG. 1 shows the generic two-step subranging architecture, comprising a reference ladder 104, a coarse ADC 102, a switching matrix 103, a fine ADC 105, coarse comparators 107, fine comparators 108 and an encoder 106. In most cases, a track-and-hold 101 is used in front of the ADC. In this architecture, an input voltage is first quantized by the coarse ADC 102. The coarse ADC 102 compares the input voltage against all the reference voltages, or against a subset of the reference voltages that is uniformly distributed across the whole range of reference voltages. Based on a coarse quantization, the switching matrix 103 connects the fine ADC 105 to a subset of the reference voltages (called a "subrange") that is centered around the input signal voltage.

A flash ADC architecture is the most straightforward implementation of an analog-to-digital converter. Unfortunately, it is very inefficient in terms of area and power. In particular, an N-bit ADC requires $2^N$ comparators. Furthermore, it requires a reference ladder with $2^N$ taps, which generally causes a lot of wiring parasitic capacitance, slowing down the ADC.

A subranging ADC architecture is often used as a more power- and area-efficient alternative to the flash ADC architecture. While subranging does help to reduce the number of comparators, it does not help to reduce the number of taps on the reference ladder. In fact, the situation is complicated by the fact that subranging requires a switching matrix with a large number of switches. Parasitic capacitance associated with these switches slows down the ADC even further.

Figure 2:
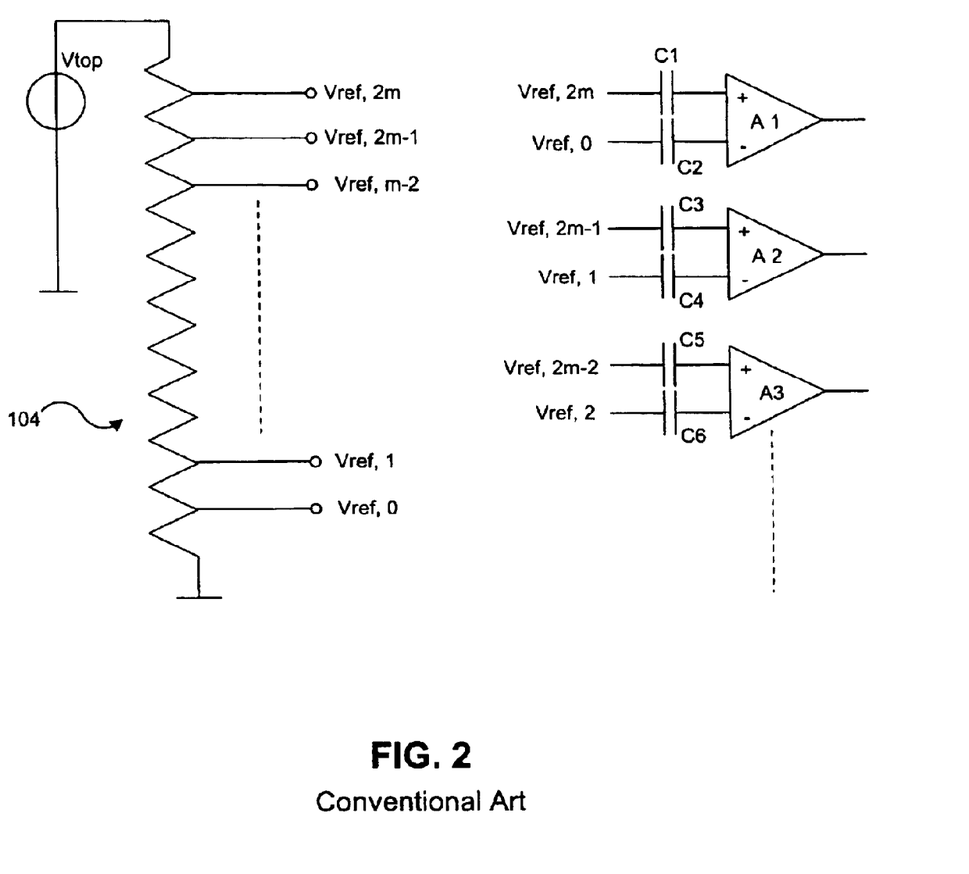
FIG. 2 illustrates a conventional way of connecting a first row of amplifiers to a reference ladder.

A conventional way of connecting the first row of amplifiers to the reference ladder is shown in FIG. 2: amplifier A1 connects to reference taps "2m" and "0", amplifier A2 connects to a "2m−1" tap and a "1" tap, etc. Thus, in a "brute force" flash ADC, the reference ladder 104 has $2^N=2m$ taps (e.g., 1024 taps for N=10).

Three techniques have been published in the literature for decreasing the number of switches in subranging ADC's. First, interpolation between preamplifier output voltages is often used. Interpolation is often applied in both flash ADC's, subranging ADC's and folding ADC's. This form of interpolation reduces the number of amplifiers in a first array of amplifiers. Since only the first array of amplifiers needs connections to the reference ladder 104, this technique reduces the required number of reference taps and switches. For example, 4× interpolation within the fine ADC 105 reduces the number of switches by 75%.

A second technique for reducing the number of switches is referred to as "absolute value processing." See B. P. Brandt and J. Lutsky. "A 75-mW, 10-b, 20-MSPS CMOS subranging ADC with 9.5 effective bits at Nyquist," *IEEE Jour. of Solid State Circ.*, 34(12):1788–1795 (December 1999). This technique uses the fact that the absolute value function can be implemented simply by a commutator, basically comprising only four switches. This technique reduces the required number of switches in the matrix 103 by another 50%. Note that this technique does not reduce the number of taps on the reference ladder. 104.

A third technique called "multilevel tree decoding scheme" decreases the number of switches by 62.5%. (See, e.g., Ito et al., "A 10-bit 20 MS/s 3V Supply CMOS A/D converter," *IEEE J. of Solid State Circ.*, 29 (12):1532–36, December 1994) Note that this technique does not reduce the number of taps on the reference ladder 104.

For example, a 10-bit analog digital converter in a "brute force" flash type configuration would require $2^{10}$, or 1024 taps on the reference ladder, which is very awkward. Thus, the problem involves the total number of taps required from the reference ladder, as well as the number of switches in the switch matrix for a subranging analog digital converter. It is therefore desirable to reduce the number of taps, which reduces the amount of parasitic capacitance due to the connections involved.

Accordingly, a need exists for an ADC circuit topology that significantly reduces the number of switches and taps from the reference ladder 104.

SUMMARY OF THE INVENTION

The present invention is directed to an analog to digital converter that substantially obviates one or more of the problems and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided an N-bit analog to digital converter including a reference ladder connected to an input having a plurality of taps voltage at one end, and to ground at another end. An array of differential amplifiers has differential inputs connected to taps from the reference ladder, wherein each amplifier has one differential input that is the same as a neighboring amplifier, and another differential input shifted by one tap from the neighboring amplifier. An encoder converts outputs of the amplifier array to an N-bit output.

In another aspect of the present invention there is provided an N-bit analog to digital converter including a plurality of differential amplifiers whose differential inputs are connected to a plurality of taps from a reference ladder, wherein any pair of neighboring amplifiers has one each amplifier has one set of differential inputs of the same polarity that have the same input, and one set of differential inputs of the same polarity that have inputs that represent adjacent taps from the reference ladder. An encoder converts outputs of the amplifier array to an N-bit output.

In another aspect of the present invention there is provided an analog to digital converter including a plurality of amplifiers whose inputs are connected to a plurality of taps from a reference ladder. Each amplifier has a first input of a first polarity representing one tap of the reference ladder such that adjacent amplifiers share the one tap. Each amplifier has a second input of a second polarity, such that adjacent amplifiers have inputs from adjacent taps. An encoder converts outputs of the amplifier array to an N-bit output.

In another aspect of the present invention there is provided an analog to digital converter including a plurality of amplifiers whose inputs are connected to a plurality of taps from a reference ladder and to an input signal. Each amplifier has inputs shifted by half a tap relative to its adjacent amplifier. An encoder converts outputs of the amplifiers to an N-bit output.

In another aspect of the present invention there is provided an analog to digital converter including a plurality of amplifiers whose inputs are connected to a plurality of taps from a reference ladder and to an input signal. Each amplifier has one input that it shares with an opposite polarity input of one adjacent amplifier, and one input that it shares with an opposite polarity input of another adjacent amplifier. An encoder that converts outputs of the amplifiers to an N-bit output.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

One of the disadvantages of the subranging ADC architecture is the large number of switches required, resulting in degraded high-frequency performance. This disclosure describes how the required number of switches can be significantly reduced by interpolation of the reference ladder. Three new interpolation techniques are proposed.

All three techniques accomplish interpolation of the reference ladder taps. Since all three techniques can be applied to both subranging and flash ADC's, for simplicity they will be illustrated with respect to the flash architecture, showing a reduction in reference ladder taps that can be accomplished. Note that for subranging architectures, a reduction in the required number of switches equals a reduction in number of reference taps.

Figure 3:
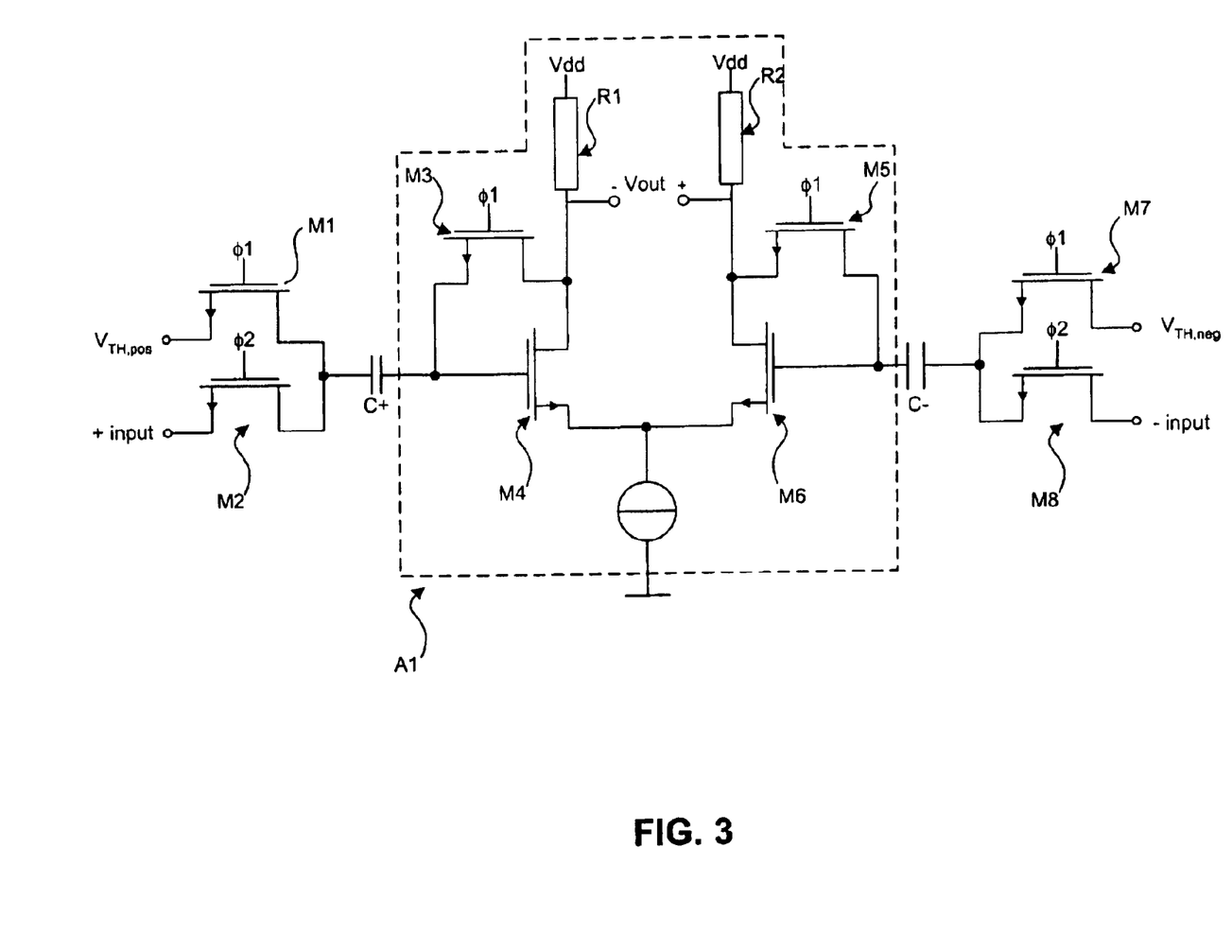
FIG. 3 illustrates an auto-zero amplifier used in the present invention.

The techniques are illustrated based on the auto-zero amplifier shown in FIG. 3. FIG. 3 illustrates the structure of one of the amplifiers in an amplifier array A1, A2, A3 ... of FIG. 4, discussed below. As shown in FIG. 3, a non-overlapping two-phase clock is used, with non-overlapping phases $\phi_1$ and $\phi_2$. At a "+" input of the amplifier, two NMOS transistors M1 and M2 are used, with a source of the transistor M2 being connected to the "+" input terminal, and a gate of the transistor M2 being connected to the clock phase $\phi_2$. The "+" and "−" inputs are connected to taps from the reference ladder 104.

A gate of the transistor M1 is driven by the clock phase $\phi_1$. The drains of the transistors M1 and M2 are tied together and connected to one side of a capacitor C+. A source of M1 is connected to the positive T/H 101 output, and a source of M7 is connected to the negative T/H 101 output. The gates of M1 and M7 are driven by $\phi_1$. The other side of the capacitor C+ is connected to a source of a transistor M3, and to a gate of a transistor M4. A gate of the transistor M3 is connected to the clock phase $\phi_1$. Drains of the transistors M3 and M4 are tied together and, through resistor R1, to a positive supply voltage $V_{dd}$. A symmetrical structure is used for the "−" input, as shown in FIG. 3, using transistors M8, M7, M6 and M5, and a capacitor C−. The amplifier has differential outputs $V_{OUT+}$, $V_{OUT-}$. The dashed portion corresponds to the amplifier A1 shown in subsequent figures.

During clock phase $\phi_1$ the amplifier is in a reset mode and the sampling capacitors are charged to the value of the sampled voltage $V_{sample}$. More specifically, on $\phi_1$, the transistors M1, M3, M5 and M7 are turned on. During the next clock phase, $\phi_2$, the transistors M2 and M8 are turned on, the amplifier is connected to the reference ladder 104 and the amplifier output voltage $V_{out}$ equals: $V_{out}=G \cdot (V_{ref}-V_{sample})$, where G is the voltage gain of the amplifier, $V_{ref}=V_{+input}-V_{-input}$ and $V_{sample}=V_{TH, pos}-V_{TH, neg}$, where $V_{TH}$ is the differential output of the track and hold 101.

It will be appreciated that although the auto-zeroing amplifier of FIG. 3 is shown as using N channel MOSFET's, P channel MOSFET's can also be used. Note further that the track-and-hold 101 of FIG. 1 is typically a differential input and output amplifier that is connected to differential outputs of the track and hold amplifier 110, $V_{TH, pos}$ and $V_{TH, neg}$.

Figure 4:
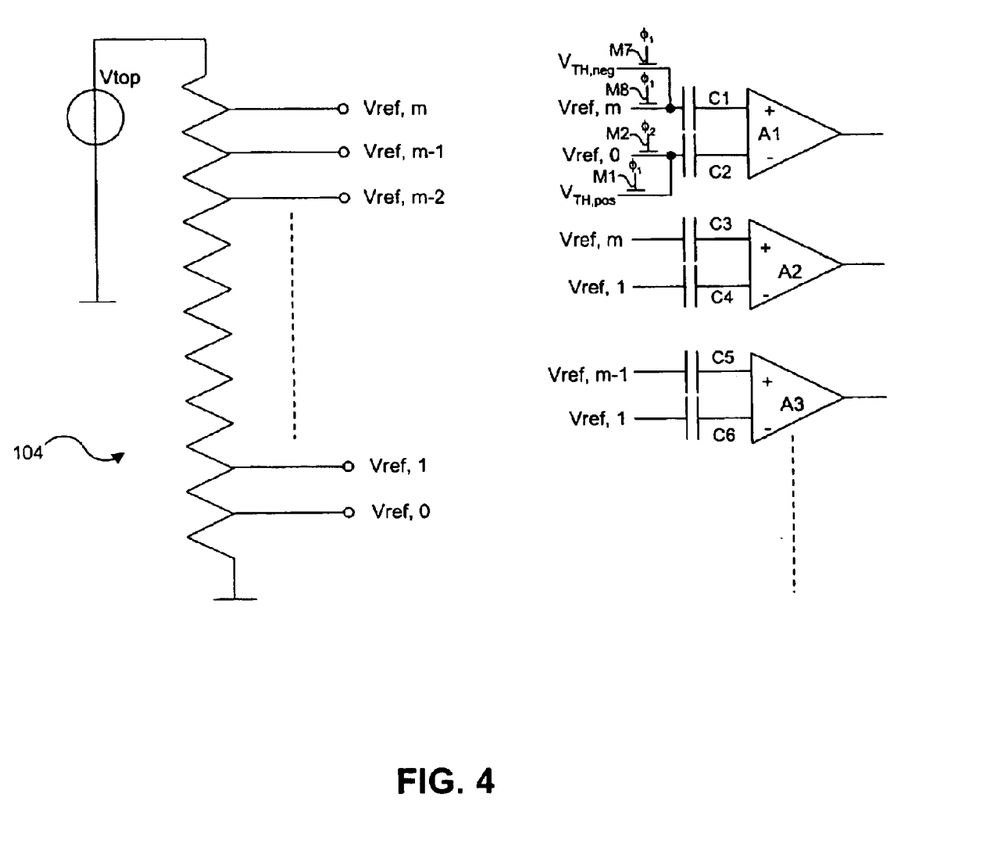
FIG. 4 illustrates a first technique for connecting amplifiers of the present invention to the reference ladder.

FIG. 4 illustrates a first interpolation technique, and shows that about 50% reduction in the number of taps can be obtained if only the positive or the negative reference input is changed when going from one amp to the next. That is, amplifier A1 in FIG. 4 connects to reference taps "m" and "0", amplifier A2 connects to "m" and "1", so that only the negative input changes from A1 to A2; amplifier A3 connects to "m−1" and "1", etc. In other words, a reference ladder 104 has a plurality of taps $V_{ref,0}$ through $V_{ref,m}$. FIG.

4 also shows each of the amplifiers A1, A2, A3 . . . has a capacitor at each input. Thus, the amplifier A1 has a capacitor C1 at its "+" input, and capacitor C2 at its "−" input. The amplifier A2 has capacitor C3 at its "+" input, and capacitor C4 at its "−" input, and so on. The transistors M1, M2, M7 and M8 correspond to the transistors shown in FIG. 3 (and are only shown for the amplifier A1 for clarity). The capacitors C1, C2 correspond to the capacitors C−, C+ of FIG. 3.

As maybe seen from FIG. 4, the amplifier A1 is connected to taps $V_{ref,m}$ and $V_{ref,0}$. The amplifier A2 is connected to $V_{ref,m}$ and $V_{ref,1}$. The amplifier A3 is connected to $V_{ref,m-1}$ and $V_{ref,1}$, and so forth. Comparing FIG. 2 with FIG. 4, in FIG. 4, neighboring amplifiers have only one of their inputs changed, compared to neighboring amplifier in FIG. 2, where both of the inputs are changed. In other words, with reference to FIG. 2, in FIG. 2 both the "+" inputs on the amplifiers A1 and A2 change (from $V_{ref,2m}$ to $V_{ref,2m-1}$) as well as the "−" inputs change (from $V_{ref,0}$ to $V_{ref,1}$). In contrast, in FIG. 4, the "+" inputs of the amplifiers A1 and A2 are both the same ($V_{ref,m}$), while the "−" inputs of the amplifiers A1 and A2 change from $V_{ref,0}$ to $V_{ref,1}$. Thus, only one of the inputs changes when going from one amplifier to a neighboring amplifier.

It will be appreciated that the terms "adjacent" and "neighboring" are used in their hierarchical sense compared to the taps from the reference ladder 104, rather than in the sense of how the overall circuit is actually laid out. Thus, although an actual layout would most likely have the amplifiers A1, A2, A3 . . . laid out close to each other, this need not be the case.

It will be appreciated that unlike FIG. 2, which requires a total of 1024 taps for a 10-bit analog digital converter, e.g., $2^N$ in a "brute force" approach, the number of taps required for the circuit of FIG. 4 to operate is half that (or $2^N \div 2$). Note also that the $2^N \div 2$ figure assumes that no interpolation is used.

The proposed technique results in common-mode differences at the inputs of the amplifiers. This is only a minor disadvantage, since the amplifiers generally have good common-mode rejection and the common-mode differences are quite small.

The outputs of the amplifiers (or, if necessary, cascaded stages of amplifiers) are fed into a comparator array (not shown, see 108 of FIG. 1), and then to an encoder (not shown, see 106 of FIG. 1).

Figure 5:
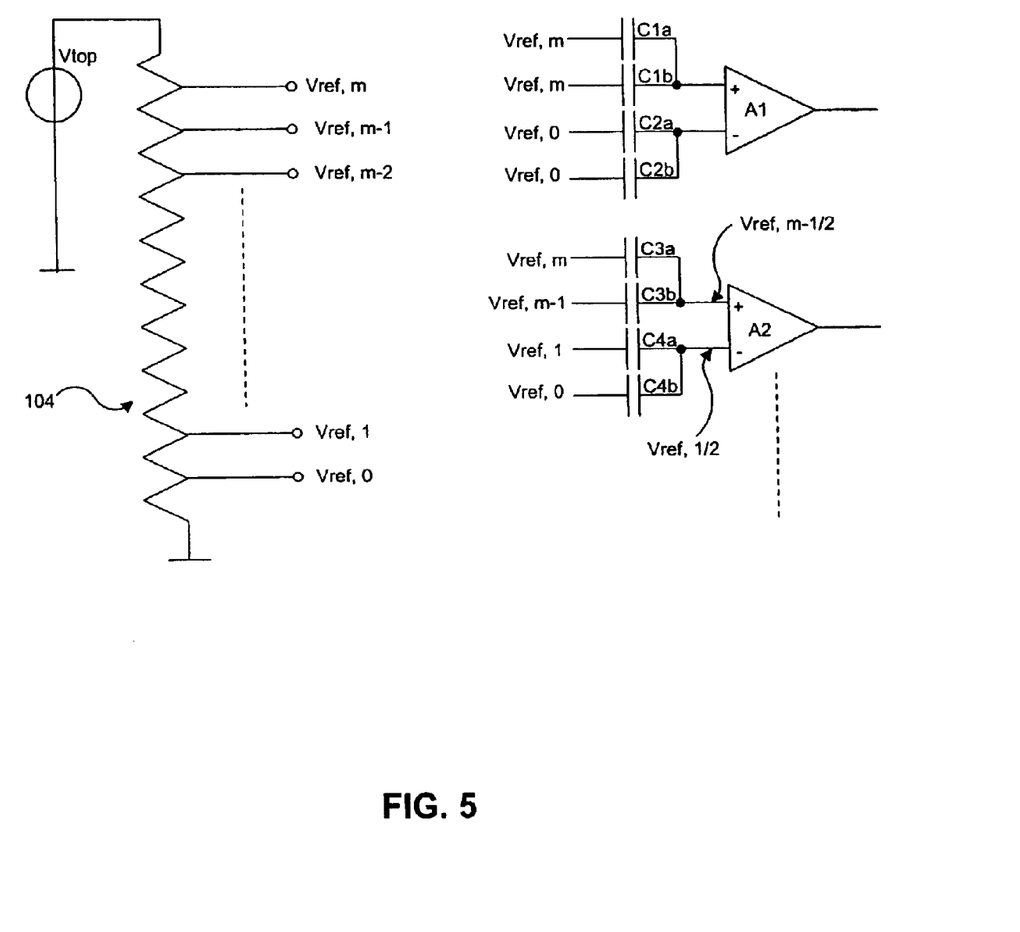
FIG. 5 illustrates the approach of FIG. 4 with split capacitor interpolation.

A second technique accomplishing reference ladder interpolation is illustrated in FIG. 5. Here, the input sampling capacitors C1, C2 . . . of the amplifiers A1, A2, A3 . . . are split into two parts, effectively providing each amplifier with two positive and two negative reference inputs. The capacitor C1 is split up into the capacitors C1a and C1b, and the capacitor C2 is split up into the capacitors C2a and C2b. The capacitor C3 is split up into capacitors C3a and C3b, the capacitor C4 is split up into capacitors C4a and C4b, and so on. The two positive reference inputs can be connected to different reference taps, thus implementing interpolation of the reference ladder 104. The same applies to the two negative reference inputs. As an example, the two positive reference inputs shown in FIG. 5 are connected to taps "m" and "m−1". The "+" input of A2 is effectively connected to a "virtual" tap $V_{ref,m-1/2}$. The "−" input is effectively connected to a "virtual" tap $V_{ref,1/2}$. Thus, this interpolation technique allows an additional reduction of 50% in the number of tap lines from the reference ladder 104.

Note that in terms of circuit layout on a semiconductor substrate, it is easier to split up a capacitor into two smaller capacitors, rather than having more taps from a reference ladder, since the primary source of parasitics is the number of tap lines from the reference ladder 104. A reduction of tap lines therefore results in a reduction in parasitic capacitance associated with the additional tap lines.

It will also be appreciated by one of ordinary skill in the art that the interpolation approach of FIG. 5 does not require that the capacitors at the input of each amplifier be equal. Thus, the interpolation technique will work if each capacitor split up into capacitors having different values, as appropriate for the voltage required at the particular input of the amplifier. It will also be appreciated that each input capacitor can be split up into more than two capacitors, e.g., capacitor C3 may be split up into capacitors C3a, C3b, C3c, although as each capacitor gets smaller, eventually the use of such small capacitors for interpolation will become problematic.

Figure 6:
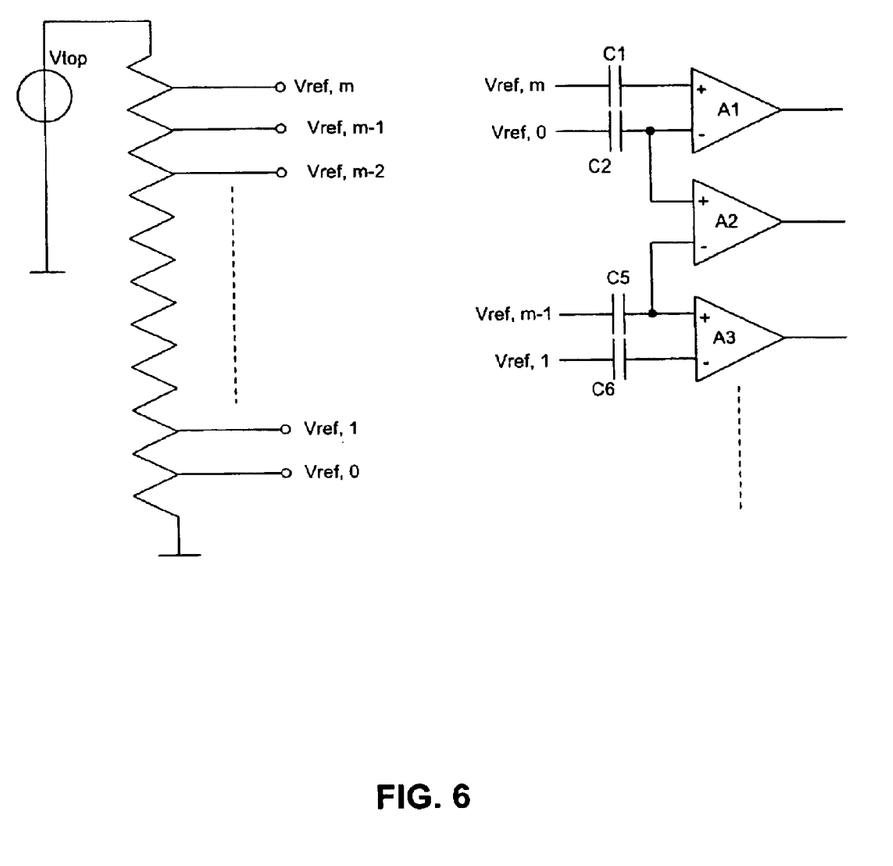
FIG. 6 illustrates the approach of FIG. 5 with interpolation of sampling capacitor outputs.

A third technique accomplishing reference ladder interpolation is illustrated in FIG. 6. FIG. 6 shows that not all input amplifiers need to be connected to the reference taps. Interpolation of the sampling capacitor "outputs" can be used to reduce the required number of reference taps. In the example shown in FIG. 6, a reduction of about 50% is obtained.

As may be seen from FIG. 6, not every amplifier in the amplifier array A1, A2, A3 . . . needs to have its own tap line, particularly where the adjacent, or neighboring, amplifier uses the same tap line. Thus, the "−" input of the amplifier A1, which in FIG. 4 is connected to $V_{ref,0}$ tap, can be directly connected to the "+" input of the amplifier A2, which in FIG. 4 is also connected to the $V_{ref,0}$ tap. Similarly, since the "+" input of A3 and the "−" input of the amplifier A2 are connected to the same voltage $V_{ref,m-1}$ tap, the "−" input of the amplifier A2 does not require its own tap, but can be directly connected to the "+" input of the amplifier A3. This will further reduce the number of tap lines and tap connections from the reference ladder to the amplifier array. The technique shown in FIG. 6 may be referred to as "interpolate by 2" technique, which results in a 50% reduction in the overall number of tap connections. It also results in the elimination of approximately half of the input capacitors, compared to the technique shown in FIG. 4.

Figure 7:
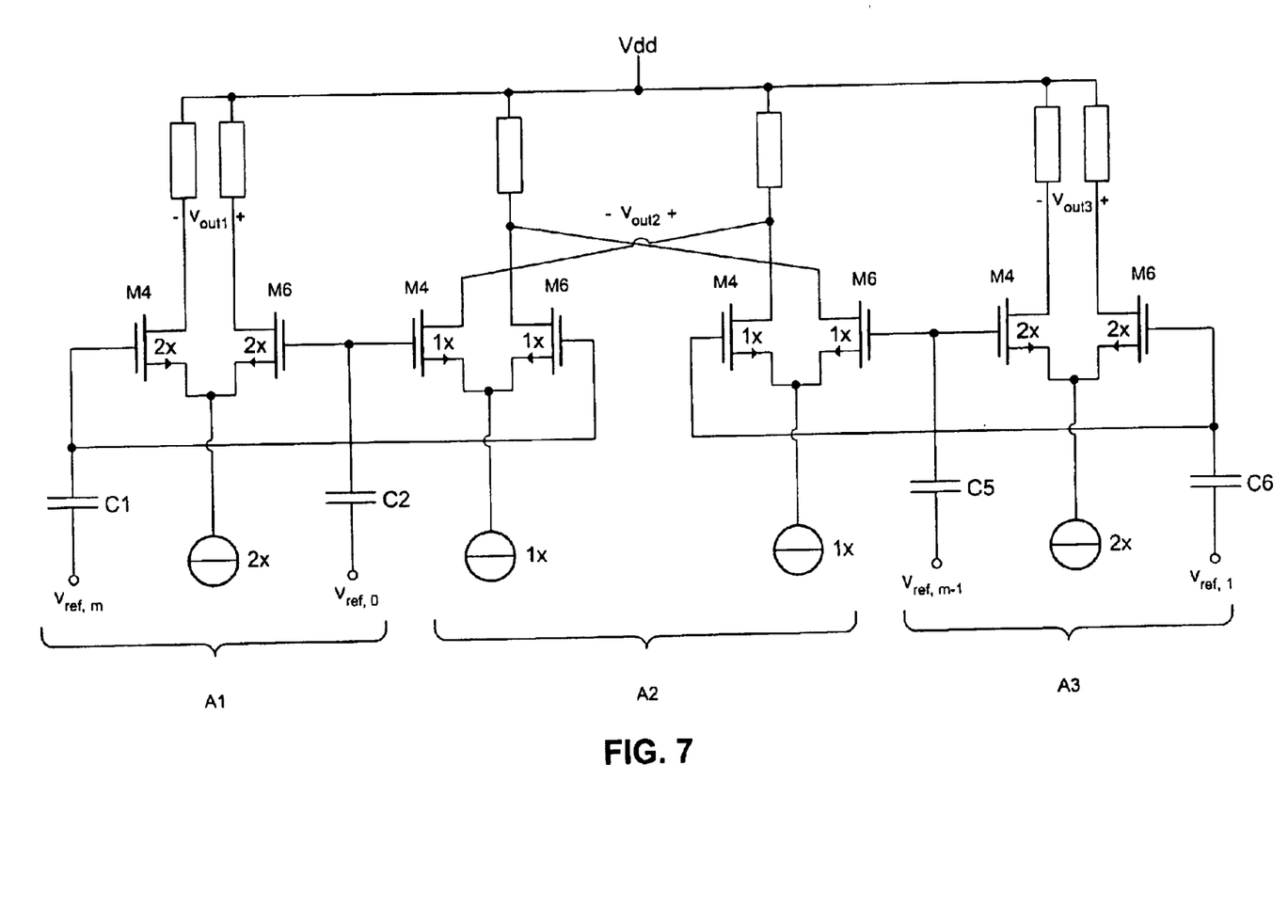
FIG. 7 illustrates a circuit diagram corresponding to the approach of FIG. 6.

FIG. 7 illustrates the approach of FIG. 6 in more detail and shows the three amplifiers A1, A2, A3 of FIG. 6 (without the switches driven by the two phase clock). The A1 and A3 amplifiers have their own input capacitors (C1, C2, and C5, C6, respectively), the A1 amplifier has differential inputs $V_{ref,m}/V_{ref,0}$, the amplifier A3 has differential inputs $V_{ref,m-1}/V_{ref,1}$. The amplifier A2 does not have its own input capacitors. Instead, the amplifier A2 comprises two differential transistor pairs M4, M6 (both half the size of the differential pairs M4, M6 of A1 and A3). It's current sources are each half of the current source of A1 or A3. Gates of one of the transistor pairs M4, M6 connect to the gates of the corresponding transistors of the A1 amplifier, and gates of the other differential transistor pair M4, M6 connect to corresponding gates of transistors of the A3 amplifier. The drain currents of the two differential transistor pairs of A2 are summed. As a result, the output of the amplifier A2 ($V_{OUT,2}$) is (approximately) equal to the average of the outputs of A1 and A3 (i.e., the average of $V_{OUT,1}$ and $V_{OUT,3}$).

The reference ladder interpolation techniques described here can be applied to various types of ADC architectures. In flash and folding ADC architectures, they can be used to reduce the number of taps on the reference ladder 104. In subranging ADC architectures, they reduce both the number of reference taps and the number of switches.

It will be appreciated by one with ordinary skill in the art that techniques described herein are applicable to both flash type ADC's, folding ADC's and subranging ADC's.

Figure 8:
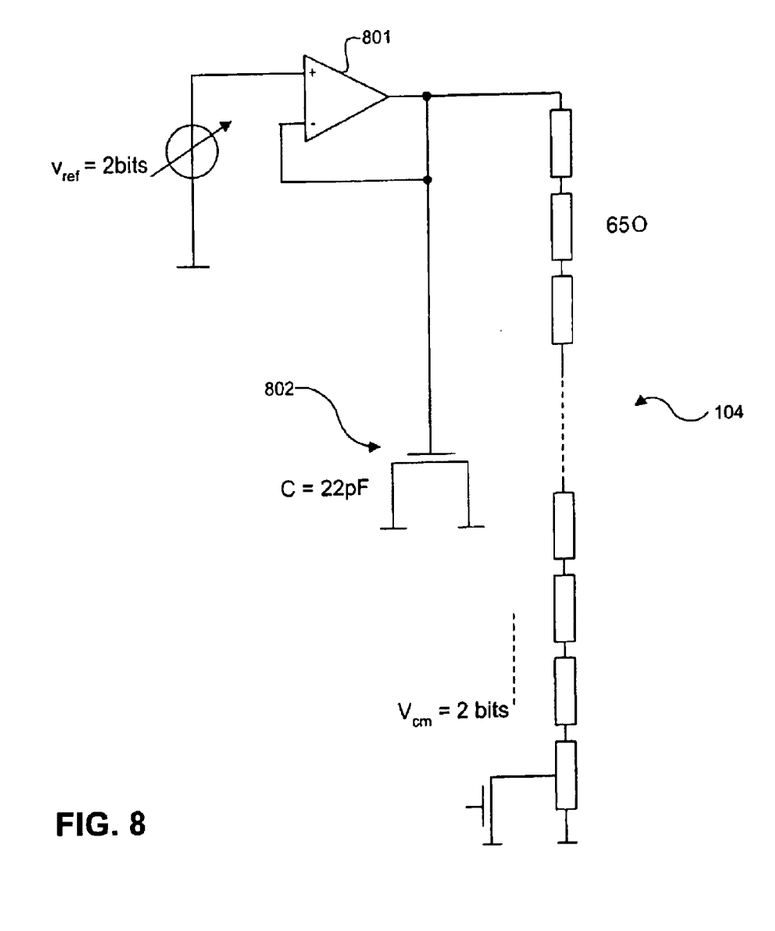
FIG. 8 illustrates a reference ladder used in the present invention.

FIG. 8 illustrates a reference ladder arrangement of one embodiment of the present invention. The reference ladder 104 includes a plurality of 65Ω resistors which are connected to a relatively slow amplifier 801. (The bandwidth of the amplifier 801 as approximately 1–2 MHz). The output of the amplifier 801 is also tied to its "−" input, and to a transistor 802, whose both source and drain are tied to ground, forming a 22 pF capacitor.

All three techniques can be applied at the same time, in order to obtain a very significant reduction in the number of reference taps and matrix switches.

For example, for an N=9 bit ADC, the reduction in number of taps is as follows:

| | |
|---|---|
| full flash for N = 9: | 512 taps ($2^N$) |
| 2x capacitive interpolation at ladder: | 256 taps ($2^{N-1}$) |
| change $V_{ref,p}$ or $V_{ref,n}$ only: | 128 taps ($2^{N-2}$) |
| 2x interpolation of the "outputs" of the sampling caps | 64 taps ($2^{N-3}$) |
| 4x split differential pair interpolation: | 16 taps ($2^{N-5}$) |
| edge effect (add one or two): | 17 taps |

The table below illustrates the tap voltages for the 17-tap case:

| Tap # | Tap voltage |
|---|---|
| 16 | 0.95 |
| 15 | 0.90625 |
| 14 | 0.8625 |
| 13 | 0.81875 |
| 12 | 0.775 |
| 11 | 0.73125 |
| 10 | 0.6875 |
| 9 | 0.64375 |
| 8 | 0.6 |
| 7 | 0.55625 |
| 6 | 0.5125 |
| 5 | 0.46875 |
| 4 | 0.425 |
| 3 | 0.38125 |
| 2 | 0.3375 |
| 1 | 0.29375 |
| 0 | 0.25 |

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An input stage of an analog to digital converter comprising:
an array of differential amplifiers whose differential inputs are connected to interpolated voltage taps and to a signal input,
wherein each differential amplifier has a first differential input connected to the same interpolated voltage tap as a neighboring amplifier, and a second differential input shifted by an integer number of interpolated voltage taps from the neighboring amplifier, and
wherein a zero crossing of outputs of the differential amplifiers represents the signal input.

2. The input stage of claim 1, wherein each differential input of each differential amplifier is connected to a capacitor.

3. The input stage of claim 2, wherein each capacitor includes at least two sub-capacitors.

4. The input stage of claim 1, wherein a total number of interpolated voltage taps is approximately $2^{N-1}$ for an N-bit analog to digital converter.

5. The input stage of claim 1, wherein a total number of interpolated voltage taps is approximately $2^{N-2}$ for an N-bit analog to digital converter.

6. The input stage of claim 1, wherein a total number of interpolated voltage taps is approximately $2^{N-3}$ for an N-bit analog to digital converter.

7. The input stage of claim 1, wherein the interpolated voltage taps are based on taps from a reference ladder.

8. The input stage of claim 1, wherein at least one of the differential amplifiers has a positive differential input connected to a negative differential input of one neighboring differential amplifier, and a negative differential input connected to a positive differential input of another neighboring differential amplifier.

9. The input stage of claim 1, wherein each differential input of each differential amplifier shares an input capacitor with an opposite polarity input of a neighboring amplifier.

10. The input stage of claim 1, wherein the analog to digital converter is a flash converter.

11. The input stage of claim 1, wherein the analog to digital converter is a subranging converter.

12. The input stage of claim 1, wherein the analog to digital converter is a folding converter.

13. The input stage of claim 1, further including a plurality of comparators configured to latch the outputs of the differential amplifiers array as inputs, and configured to output signals to an encoder to be converted to N-bit output.

14. An input stage of an analog to digital converter comprising:
a plurality of differential amplifiers whose differential inputs are connected to interpolated voltage taps and to a signal input,
wherein any pair of neighboring differential amplifiers has one set of differential inputs of the same polarity connected to the same interpolated voltage tap, and one set of differential inputs of the same polarity connected to a different interpolated voltage tap, and
wherein a zero crossing of outputs of the differential amplifiers represents the signal input.

15. The input stage of claim 14, wherein each differential input to each amplifier is connected to a capacitor.

16. The input stage of claim 15, wherein each capacitor includes at least two sub-capacitors.

17. The input stage of claim 14, wherein a total number of interpolated voltage taps is approximately $2^{N-1}$ for an N-bit analog to digital converter.

18. The input stage of claim 14, wherein a total number of interpolated voltage taps is approximately $2^{N-2}$ for an N-bit analog to digital converter.

19. The input stage of claim 14, wherein a total number of interpolated voltage taps is approximately $2^{N-3}$ for an N-bit analog to digital converter.

20. The input stage of claim 14, wherein the interpolated voltage taps are based on taps from a reference ladder.

21. The input stage of claim 14, wherein at least one of the amplifiers has a positive differential input connected to a negative differential input of one neighboring differential amplifier, and a negative differential input connected to a positive differential input of another neighboring differential amplifier.

22. The input stage of claim 14, wherein each differential input of each amplifier shares an input capacitor with an opposite polarity input of a neighboring amplifier.

23. The input stage of claim 14, wherein the analog to digital converter is a flash converter.

24. The input stage of claim 14, wherein the analog to digital converter is a subranging converter.

25. The input stage of claim 14, wherein the analog to digital converter is a folding converter.

26. The input stage of claim 14, further including a plurality of comparators configured to latch the outputs of the differential amplifiers array as inputs, and configured to output signals to an encoder to be converted to N-bit output.

27. An input stage of an analog to digital converter comprising:
    an array of differential amplifiers whose inputs are connected to interpolated voltage taps and to a signal input,
    wherein each amplifier has a first polarity input corresponding to one interpolated tap such that adjacent amplifiers share the one interpolated voltage tap, and
    wherein each amplifier has a second polarity input such that adjacent amplifiers are connected to other interpolated voltage taps, and
    wherein a zero crossing of outputs of the differential amplifiers represents the signal input.

28. The input stage of claim 27, wherein each input to each amplifier is connected to a capacitor.

29. The input stage of claim 28, wherein each capacitor includes at least two sub-capacitors.

30. The input stage of claim 27, wherein a total number of interpolated voltage taps is approximately $2^{N-1}$ for an N-bit analog to digital converter.

31. The input stage of claim 27, wherein a total number of interpolated voltage taps is approximately $2^{N-2}$ for an N-bit analog to digital converter.

32. The input stage of claim 27, wherein a total number of interpolated voltage taps is approximately $2^{N-3}$ for an N-bit analog to digital converter.

33. The input stage of claim 27, wherein the interpolated voltage taps are based on taps from a reference ladder.

34. The input stage of claim 27, wherein at least one of the amplifiers has the first polarity input connected to the second polarity input of one neighboring amplifier, and the second polarity input connected to the first polarity input of another neighboring amplifier.

35. The input stage of claim 27, wherein each input of each differential amplifier shares an input capacitor with an opposite polarity input of a neighboring amplifier.

36. The input stage of claim 27, wherein the analog to digital converter is a flash converter.

37. The input stage of claim 27, wherein the analog to digital converter is a subranging converter.

38. The input stage of claim 27, wherein the analog to digital converter is a folding converter.

39. The input stage of claim 27, further including a plurality of comparators that input the outputs of the amplifiers, and output them to an encoder to be converted to N-bit output.

40. An input stage of an analog to digital converter comprising:
    a plurality of amplifiers whose inputs are connected to a plurality of interpolated voltage taps and to a signal input,
    wherein each amplifier has inputs shifted by a fraction of an interpolated voltage tap relative to its adjacent amplifier, and
    wherein a zero crossing of outputs of the differential amplifiers represents the signal input.

* * * * *